United States Patent [19]
Roderick et al.

[11] Patent Number: 5,872,456
[45] Date of Patent: Feb. 16, 1999

[54] APPARATUS FOR DIRECTLY MEASURING COMPONENT VALUES WITHIN AN RF CIRCUIT

[75] Inventors: Craig Alan Roderick, San Jose; Viktor Shel, Milpitas, both of Calif.

[73] Assignee: Applied Materials, Inc., Santa Clara, Calif.

[21] Appl. No.: 862,230

[22] Filed: May 23, 1997

[51] Int. Cl.$^6$ .................................................. G01R 27/26
[52] U.S. Cl. ........................... 324/637; 324/464; 324/95; 250/282
[58] Field of Search .................................. 324/637, 639, 324/459, 464, 750, 765, 95; 438/792; 336/84 C; 250/282

[56] References Cited

U.S. PATENT DOCUMENTS

| | | | |
|---|---|---|---|
| 4,207,137 | 6/1980 | Tretola | 324/719 |
| 5,079,507 | 1/1992 | Ishida | 324/637 |
| 5,300,460 | 4/1994 | Collins | 438/792 |
| 5,467,013 | 11/1995 | Williams | 324/95 |
| 5,475,319 | 12/1995 | Hirae | 324/765 |

*Primary Examiner*—Maura K. Regan
*Attorney, Agent, or Firm*—Thomason and Moser

[57] ABSTRACT

Apparatus for directly measuring the value of a component within an RF circuit (e.g., an RF matching network within a semiconductor wafer processing system). Specifically, the apparatus applies a low frequency signal (e.g., a 1 KHz) across one or more of the components within an RF circuit using a bridge circuit that is sufficiently isolated from the RF signal to accomplish accurate measurements of the component. The apparatus monitors the amplitude of the low frequency signal across the component. The amplitude of the low frequency signal is indicative of the value of the component.

10 Claims, 1 Drawing Sheet ized by the calibration and physical robustness of the electromechanical components, the indirect method is widely used to measure the tuning element values because the environment within the RF matching unit is harsh and prone to generate substantial amounts of signal noise that interferes with direct component measurement. Such noise degrades any signals used to directly measure the value of the tuning elements.

APPARATUS FOR DIRECTLY MEASURING COMPONENT VALUES WITHIN AN RF CIRCUIT

BACKGROUND OF THE DISCLOSURE

1. Field of the Invention

The present invention relates to radio-frequency (RF) circuitry and, more particularly, to apparatus for directly measuring the values of components within an RF circuit.

2. Description of the Background Art

A plasma enhanced semiconductor wafer processing system contains a vacuum process chamber within which certain plasma enhanced processes are performed upon a semiconductor wafer. To produce a plasma within the process chamber, a reactant gas is pumped into the chamber and a high-power RF signal is coupled to the gas. The RF energy excites the reactant gas and produces a plasma within the chamber which is used to process a wafer supported within the chamber atmosphere.

To optimally couple the RF energy to the plasma, an RF matching network is used to match impedance of the RF source to the impedance of the chamber atmosphere. The RF matching network generally contains a plurality of tunable elements such as variable inductors and variable capacitors arranged in, for example, a π-network. The matching network elements are generally set to predefined values prior to applying the high-power RF signal to the matching network. The predefined values produce an approximate match for the RF signal to the chamber atmosphere. Since the impedance of the chamber atmosphere is time variant, the RF matching network must be dynamically tuned to maintain the impedance match. As such, once the plasma is excited, the RF matching network is tuned to optimally achieve a match between the RF signal and the plasma. Additionally, the matching network requires tuning as chamber conditions change during wafer processing. Tuning is generally accomplished by mechanical means such as a motor and gearing arrangement to adjust inductive and capacitive tuning elements within the matching network.

The actual values of the matching network components are generally unknown; however, the position of the tuning elements within the capacitor and/or inductor used to tune the matching network are known using a position feedback technique. Typically, a position feedback system mechanically couples a potentiometer to the tunable element and the resistance of the potentiometer varies with position of the tuning element. As such, the resistance is indicative of the tuning element position and the value of the tunable element.

Although accuracy and reliability of the indirect measurement method is limited by the calibration and physical robustness of the electromechanical components, the indirect method is widely used to measure the tuning element values because the environment within the RF matching unit is harsh and prone to generate substantial amounts of signal noise that interferes with direct component measurement. Such noise degrades any signals used to directly measure the value of the tuning elements.

Therefore, there is a need in the art for apparatus that directly measures the value of the tuning elements within an RF circuit and, in particular, within an RF matching network of a semiconductor wafer processing system.

SUMMARY OF THE INVENTION

The disadvantages heretofore associated with the prior art are overcome by the present invention of apparatus for directly measuring the value of the tunable elements within an RF circuit. Specifically, the present invention contains a low frequency source, a first transformer, a bridge circuit, an isolation inductor, a voltage follower amplifier, a second transformer, and signal measuring circuits. The low frequency source applies a low frequency signal (e.g., 1 KHz) across one or more of the components within an RF circuit. The invention monitors the amplitude of the low frequency signal developed across the component using a capacitive bridge circuit. The bridge circuit, although electrically connected to the RF circuit, is isolated from the RF circuit using at least one isolation inductor having a low insertion loss with respect to the low frequency signal and a high insertion loss with respect to the high frequency signal. To further decouple the source from the bridge circuit, the low frequency source is connected to the bridge circuit via a transformer and a low pass filter. To further suppress the RF signal with respect to the low frequency signal, the signal measured by the bridge circuit is buffered by a voltage follower amplifier and filtered by a low pass filter. To isolate the measuring circuit from the RF circuit the low frequency signal is then coupled to a precision rectifier via a transformer. The amplitude of the low frequency signal is produced by a precision rectifier. This amplitude is indicative of the value of the component, e.g., the voltage drop across a capacitor is indicative of its capacitance, and changes in amplitude indicate components value variation due to mechanical tuning of the component. To compute an absolute value for the component using the amplitude measurement, the invention optionally includes a component value computer.

In a high-power RF matching network of a semiconductor wafer processing system, the RF frequency that is tuned and matched by the matching network is 400 kHz or more, and at a high-power level, e.g., on the order of a few kilowatts, the application of a low frequency signal across the tunable elements is relatively insignificant as compared to the amplitude and frequency of the RF signal. As such, the low frequency signal does not interfere with the high frequency signal nor operation of the matching network. Additionally, the difference in frequencies between the low frequency signal and the high frequency signal make it possible for the invention to separate the low frequency signal from the high frequency signal and analyze only the amplitude of the low frequency signal.

The present invention facilitates direct measurement of the values of the components in a high-power RF circuit and, in particular, the tunable elements of a high-power RF matching network. Such direct measurement provides improved measurement accuracy over the electromechanical circuits of the prior art. As such, improvements in the match between the RF source and load leads to improved efficiency of the matching network and the overall RF system as well as improved repeatability. Consequently, in the semiconductor wafer processing art, the invention facilitates using less RF power to provide the same plasma density as was generated by the prior art system.

BRIEF DESCRIPTION OF THE DRAWING

The teachings of present invention can be readily understood by considering the following detailed description in conjunction with the accompanying drawing, in which.

DETAILED DESCRIPTION

Figure 1:
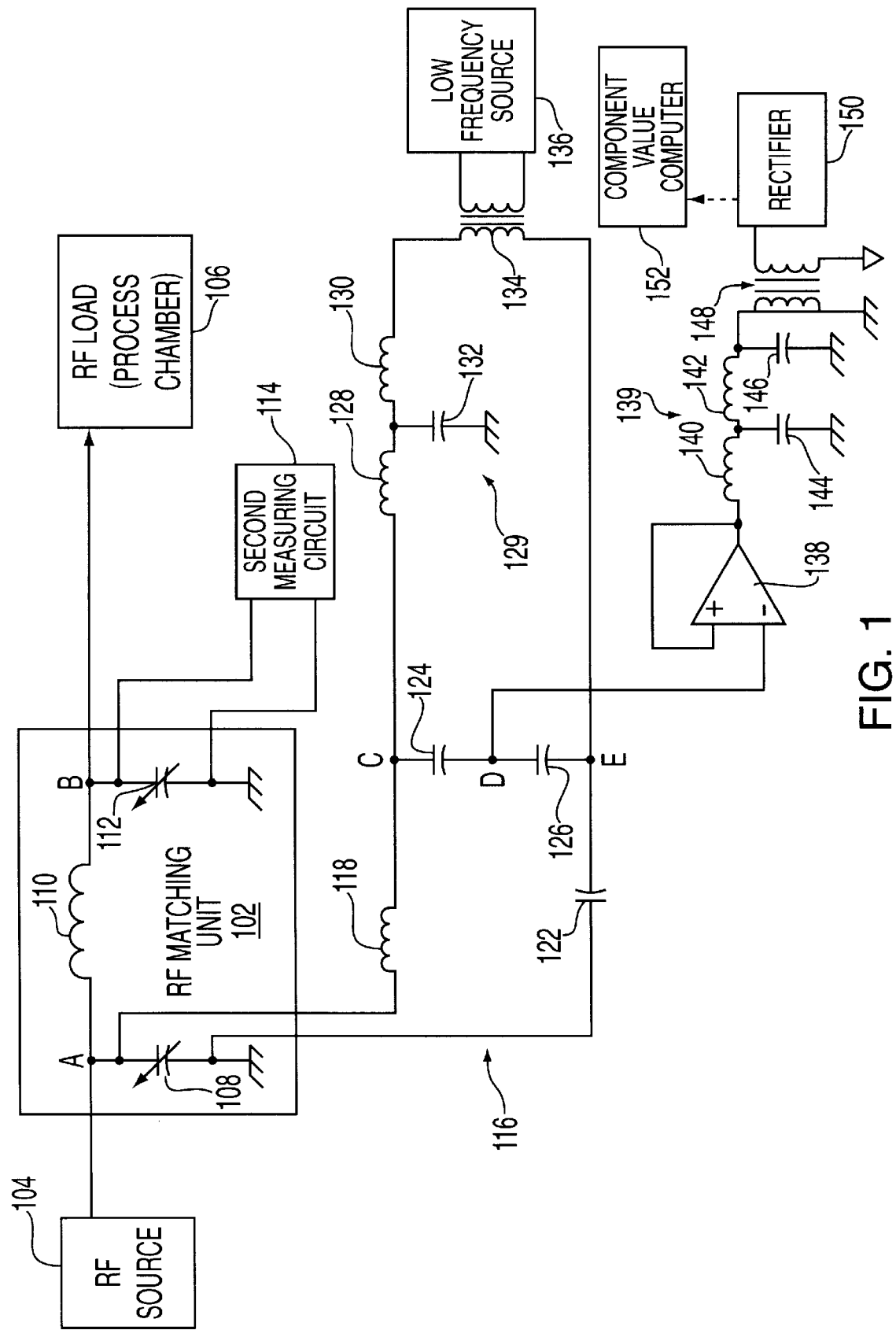
FIG. 1 is a schematic diagram of the present invention being used to illustratively measure the component values within an RF matching network.

FIG. 1 depicts a schematic diagram of the apparatus 100 of the present invention coupled to a π-type RF matching network 102. However, in its broadest sense, the invention is useful in measuring any component values in an RF circuit and, in particular, in a high-power RF matching network. Although the following description of the present invention is discussed as applied to a π-type RF matching network, those skilled in the art will understand that the invention is applicable to any form of RF matching network, e.g., T-type or L-type, where the value of the tuning elements need to be determined. Furthermore, the following description discusses the invention as used to measure the component values in an RF matching network 102 that is used to match the output impedance of an RF generator 104 to an RF load 106. The illustrative application for the invention contains an RF load that is the plasma excitation circuitry (e.g., anode and cathode) within a process chamber of a semiconductor wafer processing system.

FIG. 1 depicts the apparatus of the present invention coupled to a single tuning element (capacitor 108) of the RF matching network 102. To measure other components or tunable elements of the matching network, the circuitry of the present invention is duplicated and attached to any element for which measurement is also desired, as represented by a second measuring circuit 114.

The RF matching network 102 comprises a first capacitor 108, an inductor 110, and a second capacitor 112 arranged in a π-type network structure. Specifically, an RF generator 104 supplies the RF signal across the first capacitor 108 between Node A and ground. The inductor 110 is connected between Node A and Node B, where the second capacitor 112 is connected between Node B and ground. The output of the matching network is taken across the second capacitor 112, i.e., from Node B to ground, and coupled to the RF load 106. The present invention is attached across one of the RF components, e.g., the first capacitor 108.

The present invention includes a capacitive bridge network 116 (an unbalanced AC bridge) that is sufficiently isolated from the RF signal noise that the invention produces accurate measurements of component values. The bridge is designed to determine the value of the capacitance of the tunable element (e.g., of the component) when the capacitance of the other three capacitors within the bridge network are known. More specifically, the bridge network 116 is comprised of capacitor 124, capacitor 126 and capacitor 122, where the unknown is the value of the first capacitor 108 of the matching network 102. Node C is coupled to capacitor 124 via one or more isolation inductors 118 having a value that forms an RF choke that blocks the RF current from being coupled from the RF matching network into the inventive apparatus. The inductor 118 is coupled to one terminal of capacitor 124 and provides a high impedance with respect to the high frequency signal (RF) and a low impedance to the low frequency signal. The other terminal of capacitor 124 is coupled to the first terminal of capacitor 126. The second terminal of capacitor 126 is coupled to the first terminal of capacitor 122. The second terminal of capacitor 122 is coupled to ground of the first capacitor 108 of the matching network 110. The connection at Node D between capacitors 124 and 126 is coupled to a buffer amplifier 138 (e.g., a high input impedance voltage follower integrated circuit). Since the capacitors of the bridge network have a high impedance at the low frequency, a high input impedance amplifier is used a buffer amplifier 138. The output of the voltage follower 138 is coupled through an RF filter 139 comprising two series connected RF inductors 140 and 142 and two capacitors 144 and 146 coupled from the signal path to ground. RF filter 139 has a low insertion loss (<3 dB) with respect to the low frequency signal and a high insertion loss (>90 db) with respect to the RF signal. The output of the RF filter 139 is coupled through a transformer 148 that is tuned to the measurement frequency (low frequency) of the invention.

To facilitate measurement of the capacitance, a measuring signal is produced by a low frequency source 136 (oscillator). The measuring signal, illustratively a 1 KHz sinusoid, is coupled to Nodes C and E of the bridge circuit 116 via an RF filter 129 and a transformer 134. The transformer 134 should be considered an optional component of the circuitry. Specifically, the low frequency source 136 is coupled to a primary winding of transformer 134. A first terminal of the secondary winding of transformer 134 is coupled to Node E and a second terminal is coupled to a T-type RF filter 129. The RF filter is a low pass design having two serially connected inductors 128 and 130 and a capacitor 132 connected from the connection of the inductors to ground. The RF filter facilitates coupling the low frequency signal to Node C of the capacitive bridge circuit, but attenuates the RF signal from RF generator 104.

Using conventional unbalanced bridge network circuit analysis, the value of an RF component, e.g., first capacitor 108 of the RF matching network, can be determined by measuring the voltage at the nodal connection between capacitors 124 and 126. As such, the low frequency signal is applied across the bridge circuit 116 and the voltage measured at node D is coupled to the voltage follower 138 which provides a high impedance buffer (e.g., an FET voltage follower) such that the signal detection circuit matches the high impedance of the bridge circuit capacitors and the signal detection circuitry has minimal loading impact on the RF matching network. The low pass filter and output transformer couples the low frequency signal (1 KHz) to a precision rectifier 150. The rectifier generates a DC voltage that varies with the capacitance of the first capacitor 108 of the matching network 102. As such, as the tuning element is tuned to different values, the rectified DC voltage varies in accordance with changes in the capacitor's value. To compute an absolute value for the component, the invention optionally includes a component value computer. Consequently, the value of the tuning element is directly measured and always known. To best accomplish an absolute measurement, the inventive apparatus is calibrated using a known capacitance value prior to the apparatus being connected to the RF circuit to be measured. Additionally, to facilitate calibration and/or signal level adjustment, a gain controlled amplifier (or some other signal level controlling device) may optionally be included in the capacitance measurement circuitry. For example, a gain controlled amplifier could be located between the RF filter 139 and the transformer 148 to adjust the output signal level, as needed.

The present invention provides circuitry for direct measurement of the value of an RF component (e.g., capacitor) and, in particular, a tunable element within an RF matching network. In doing so, the circuitry isolates the high-power RF signals from the measurement circuitry providing for an accurate method of direct measurement of the tuning element values without experiencing excessive noise corruption of the measured signals. Furthermore, the measured DC signal is decoupled from the capacitive bridge circuit such that any noise that couples from the RF matching network into the capacitive bridge circuit is decoupled from the rectifier circuit by the voltage follower, RF filter and transformer.

There has thus been shown and described a novel method and apparatus for directly measuring the value of a tuning element within an RF matching circuit. Many changes, modifications, variations and other uses and applications of the subject invention will, however, become apparent to those skilled in the art after considering this specification and the accompanying drawing which disclose the embodiments thereof. All such changes, modifications, variations and other uses and applications which do not depart from the spirit and scope of the invention are deemed to be covered by the invention, which is to be limited only by the claims which follow.

What is claimed is:

1. Apparatus for directly measuring the value of a component within an RF circuit being driven by an RF source, comprising
   a bridge circuit coupled to the component;
   an isolation inductor, connected between the bridge circuit and the component, for isolating the bridge circuit from the RF source;
   a low frequency source, coupled to the bridge circuit, for applying a low frequency signal to the component via the isolation inductor and bridge circuit; and
   a voltage measuring circuit, coupled to the bridge circuit, for determining the amplitude of the low frequency signal across the component.

2. The apparatus of claim 1 wherein the RF circuit is an RF matching unit for matching the impedance of the RF source to the impedance of an RF load and wherein the component is a tunable element of the RF matching network.

3. The apparatus of claim 1 wherein the bridge circuit is a capacitive bridge circuit.

4. The apparatus of claim 1 wherein the low frequency source is coupled to the bridge circuit via a transformer and an RF filter.

5. The apparatus of claim 1 wherein the voltage measuring circuit comprises:
   a voltage follower coupled to the bridge circuit;
   an RF filter, coupled to the voltage follower, for passing the low frequency signal and attenuating an RF signal; and
   a transformer, coupled to the voltage follower, for coupling the low frequency signal to a precision rectifier.

6. The apparatus of claim 5 wherein the voltage measuring circuit further comprises:
   a component value computer, coupled to said precision rectifier, for analyzing said amplitude of said low frequency signal across said component and computing an absolute value for said component.

7. Apparatus comprising:
   an RF matching unit for matching the impedance of an RF generator to the impedance of an RF load, where said RF matching unit contains a tunable RF component;
   a capacitive bridge circuit coupled to the tunable RF component;
   an isolation inductor, connected between said capacitive bridge circuit and said tunable RF component, for isolating said bridge circuit from said RF generator;
   a low frequency source, coupled to the capacitive bridge circuit, for applying a low frequency signal to the tunable RF component via the capacitive bridge circuit and the isolation inductor; and
   a voltage measuring circuit, coupled to the capacitive bridge circuit, for determining the amplitude of the low frequency signal across the tunable RF component.

8. The apparatus of claim 7 wherein the low frequency source is coupled to the bridge circuit via a transformer and an RF filter.

9. The apparatus of claim 7 wherein the voltage measuring circuit comprises:
   a voltage follower coupled to the bridge circuit;
   an RF filter, coupled to the voltage follower, for passing the low frequency signal and attenuating an RF signal; and
   a transformer, coupled to the voltage follower, for coupling the low frequency signal to a precision rectifier.

10. The apparatus of claim 9 wherein the voltage measuring circuit further comprises:
    a component value computer, coupled to said precision rectifier, for analyzing said amplitude of said low frequency signal across said component and computing an absolute value for said component.

* * * * *